United States Patent [19]

Fournes et al.

[11] Patent Number: 5,068,127
[45] Date of Patent: Nov. 26, 1991

[54] PROCESS AND APPARATUS FOR THE SIMULTANEOUS DEPOSITION OF A PROTECTIVE COATING ON INTERNAL AND EXTERNAL SURFACES OF HEAT-RESISTANT ALLOY PARTS

[75] Inventors: Jean-Paul Fournes, Milly la Foret; René J. Morbioli, Corbeil, both of France

[73] Assignee: Societe Nationale d'Etude et de Construction de Moteurs d'Aviation "S.N.E.C.M.A.", Paris, France

[21] Appl. No.: 372,889

[22] Filed: Jun. 29, 1989

[30] Foreign Application Priority Data

Jun. 30, 1988 [FR] France .................... 88 08801

[51] Int. Cl.$^5$ .............. C23C 16/22; C23C 16/46; C23C 10/48; C23C 10/34
[52] U.S. Cl. .................. 427/237; 427/250; 427/252; 427/253; 427/405
[58] Field of Search ............ 427/237, 250, 252, 253, 427/405

[56] References Cited

U.S. PATENT DOCUMENTS

| | | | |
|---|---|---|---|
| 2,801,187 | 7/1957 | Galmiche | 427/252 |
| 2,816,048 | 12/1957 | Galmich | 427/250 |
| 2,887,407 | 5/1959 | Koch | 427/250 |
| 3,096,205 | 7/1963 | De Guisto | 427/253 |
| 3,961,910 | 6/1976 | Baladjanian et al. | 427/253 |
| 4,132,816 | 1/1979 | Benden et al. | 427/237 |
| 4,148,275 | 4/1979 | Benden et al. | 427/237 |
| 4,156,042 | 5/1979 | Hayman et al. | 427/253 |
| 4,347,267 | 8/1982 | Baldi | 427/252 |

FOREIGN PATENT DOCUMENTS 0024802  3/1981  European Pat. Off. .
827132   2/1960  United Kingdom .

Primary Examiner—Shrive Beck
Assistant Examiner—Margaret Burke
Attorney, Agent, or Firm—Oblon, Spivak, McClelland, Maier & Neustadt

[57] ABSTRACT

In a process for the simultaneous deposition of a protective coating, e.g. an aluminium based coating, on internal and external surfaces of heat-resistant alloy parts, the parts are placed in a box containing a donor material, preferably in the form of granules, comprising the metal to be deposited, and an activator separate from the donor and comprising at least an anhydrous powder of chromium fluoride $CrF_3$ to provide a source of fluorine. The box is heated to a temperature above 1000° C. and a controlled flow of a carrier gas, reducing or neutral, is introduced into the box so as to establish a circulation of gases in the box whereby fluorinated vapors from thermal decomposition of the $CrF_3$ activator contact the donor to form a volatile fluoride of the metal to be deposited, and the volatile vapor is carried into contact with the external and internal surfaces of the parts to be coated to deposit the coating thereon.

9 Claims, 1 Drawing Sheet

PROCESS AND APPARATUS FOR THE SIMULTANEOUS DEPOSITION OF A PROTECTIVE COATING ON INTERNAL AND EXTERNAL SURFACES OF HEAT-RESISTANT ALLOY PARTS

BACKGROUND OF THE INVENTION

1. Field of the invention

The invention relates to a process for the simultaneous deposition of a protective coating, particularly an aluminium-based coating, on both the external and internal surfaces of heat-resistant alloy parts, particularly nickel-, cobalt- or iron-based alloy parts, and also relates to an apparatus for carrying out of the process.

2. Summary of the prior art

French Patent No. 1 433 497 describes a vapour-phase aluminization process whereby deposited aluminium is transferred without solid-solid contact between the donor containing the metal to be deposited and the part to be coated, the donor reacting with a halide, particularly a fluoride.

More recently, U.S. Pat. Nos. 4 132 816 and 4 148 275, for example, describe processes for obtaining improved protection of the internal surfaces of hollow parts, especially cooled turbine blades having fine and complex internal networks of passages. None of these known processes, however, is entirely satisfactory. In particular, the above U.S. Pat. Nos. 4 132 816 and 4 148 275 involve complicated operating procedures utilizing twin-compartment boxes and two separate donor sources when protection is to be achieved on both external and internal surfaces of parts.

SUMMARY OF THE INVENTION

With the aim of improving results and simplifying the process, according to the invention there is provided a process for the simultaneous deposition of a protective coating on both external and internal surfaces of at least one heat-resistant alloy part comprising the steps:

providing a box containing a donor for a metal to be deposited on said at least one part to be coated and, separately from said donor, an activator constituting a source of fluorine, said activator comprising at least chromium fluoride $CrF_3$ in the form of an anhydrous powder; locating said at least one part to be coated in said box; heating said box to a temperature above 1000° C. to generate fluorinated vapours by thermal decomposition of $CrF_3$ from said activator; and introducing a controlled flow of a carrier gas into said box so as to cause circulation of gases within said box whereby said fluorinated vapours contact said donor to form a volatile fluoride vapour of said metal to be deposited and said volatile metal fluoride vapour is carried into contact with said external and internal surfaces of said at least one part to deposit said metal and thereby form said protective coating thereon.

The process is particularly suitable for forming an aluminium-based coating on nickel-, cobalt-, or iron-based alloy parts, in which case the donor metal will be aluminium.

The donor is preferably in a granular form.

The carrier gas may be a reducer or a neutral gas, and is preferably argon.

Advantageously, before carrying out the process of the invention, a preliminary coating, for example based on Cr, Pt or a complex deposition of M Cr Al Y type, may be formed on the parts, particularly the outer surfaces thereof, by any known process.

Further, according to the invention there is provided apparatus for use in a process for the simultaneous deposition of a protective coating on both external and internal surfaces of at least one heat-resistant alloy part, said apparatus comprising a box for placement in an enclosure containing a protective gas, a distributor pipe at the bottom of said box and adapted to be connected to means for supplying a controlled flow of a carrier gas into said box, a first supporting grid disposed in said box above said distributor pipe, said first grid carrying chromium fluoride $F_3Cr$ powder, and a second supporting grid disposed in said box above said first grid, said second grid carrying a donor of the metal to be deposited on said at least one part, said at least one part to be coated being disposed at the top of said box such that outlet openings from said internal surfaces are oriented towards receiving gases which, in use, circulate in said box.

Depending on the protection sought, the parts may be completely immersed in the box, or they may be disposed with portions located outside the box and possibly covered with a mask so that these portions are not coated.

In certain applications of parts made of heat-resistant alloys, especially alloys based on Ni, Co or Fe, such as in aircraft engines, it is often necessary to reconcile good characteristics of hot mechanical stability and resistance to environmental attacks in the form of oxidation or corrosion from various agents. These requirements have led to the provision of a protective coating on such parts. A process in general use for vapour phase coating in accordance with French Patent No. 1 433 497 has been found to be ineffective when it is desired to apply the protective coating on the internal surfaces of complex hollow parts. Examples of such parts which are used in aircraft engines are the main fuel distribution pipes and the cooled turbine blades having fine and complex internal passages. The process in accordance with the invention makes it possible to achieve the simultaneous deposition of a protective coating on both the external and the internal surfaces of parts of this type, under conditions facilitating implementation while at the same time ensuring satisfactory results.

Other characteristics and advantages of the invention will become apparent from the following description of examples of the process in accordance with the invention and apparatus for carrying out the process, with reference to the accompanying drawing.

DESCRIPTION OF THE PREFERRED EMBODIMENTS

Figure 1:
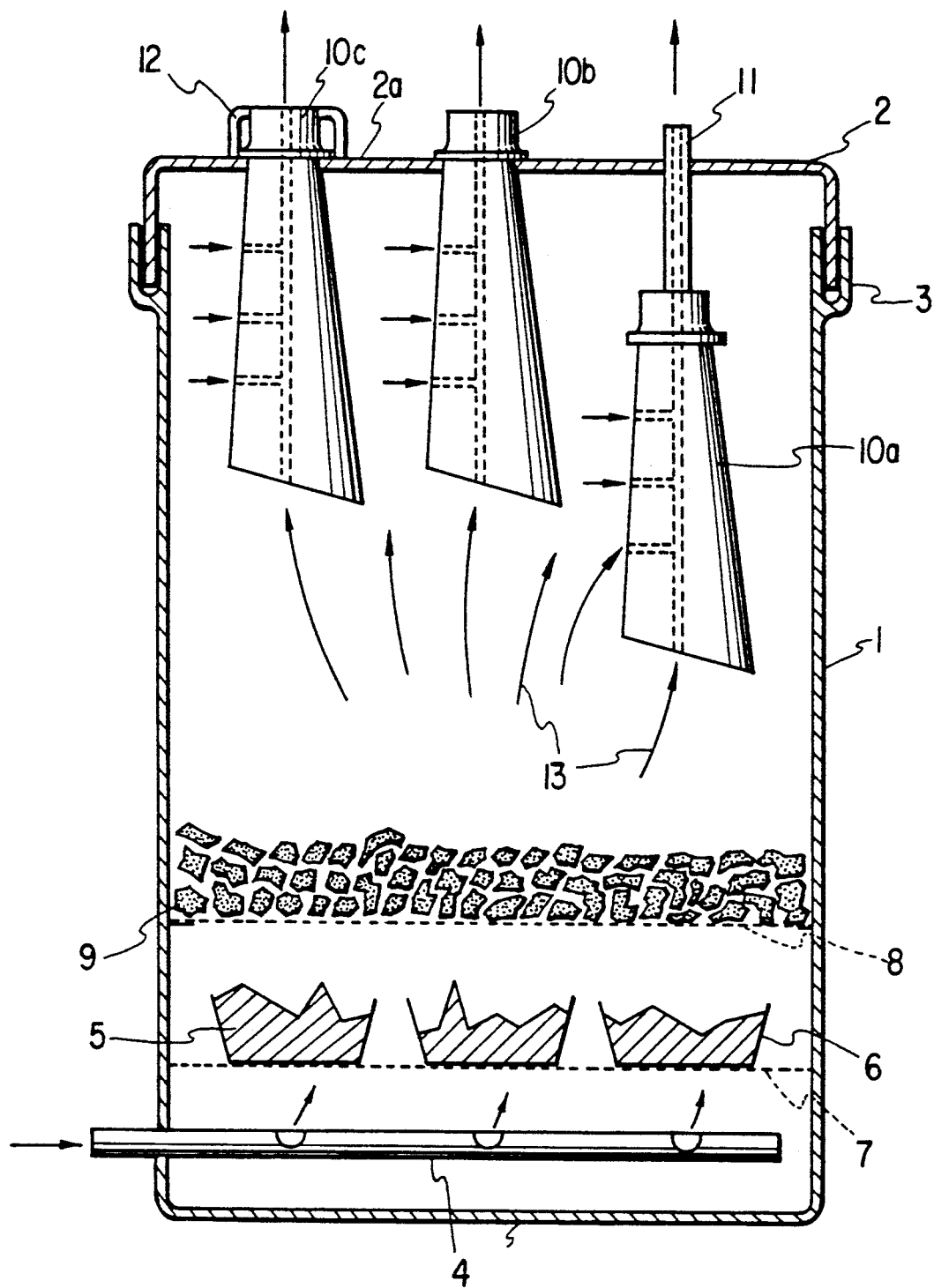
FIG. 1 shows a diagrammatic vertical section of one example of apparatus for an use in carrying out a process in accordance with the invention for the simultaneous deposition of a protective coating on both the external and internal surfaces of heat-resistant alloy parts.

The apparatus shown in FIG. 1 comprises container or box 1 provided with a cover 2 cooperating with the box at an edge 3. In use the box 1 is placed in a protective atmosphere, e.g. argon, in a treatment enclosure which may be of any known type and which is fitted with heating means, preferably electric. In the lower part of the box 1 a distributor pipe 4 is fitted, being connected externally to means of any known type for the supply of a carrier gas, which may be of a reducing or neutral type, and is preferably argon. The supply means to the main distributor pipe 4 is provided with any known device, e.g. a valve, for adjusting the flow of the carrier gas. The flow is adjusted to take account of the volume of the box 1 and the amount of the parts to be coated which fill the box, and may be determined by a simple test to achieve a sufficient circulation for the desired quality of coating to be obtained.

Above the pipe 4 there is located a bed 5 of chromium fluoride $CrF_3$, in the form of anhydrous powder, which may be mixed with an inert support of $Al_2O_3$ type, placed, for example, in pans 6 situated on a supporting grid 7. An upper support grid 8 carries a coarsely crushed donor material 9, for example in the form of granules of a size in excess of 4 mm, which, when the metal to be plated is aluminium, may be of an alloy of CA 30 type containing 70% Cr and 30% Al by weight.

In the upper part of the box 1 are located the parts 10 to be coated. When complete protection of a part is sought, the part is completely immersed in the box 1, such as shown at 10a in FIG. 1, and may be suspended by any suitable device or method, for example a tubular support 11 in which the bore permits the flow of gas from inside the part to the outside of the box. When it is desired to save on protection, the part may be suspended with the portion which is not to be coated held outside box 1, such as in the case of the parts 10b and 10c shown in FIG. 1, the parts passing through openings 2a provided in the cover 2 of box 1. A mask 12 may be used to shield the area of the part not to be coated, although in some cases a weak circulation of the external protecting gas is sufficient for the flow of non-reactive gas created around the portion not to be coated to prevent any deposition on this portion.

A protective coating process in accordance with the invention using a device as just described may be carried out as follows.

The treatment enclosure containing the box 1 is heated to a temperature in excess of 1000° C. at a rate of increase of approximately 17° C. per minute. A holding temperature generally used in the process in accordance with the invention and giving satisfactory results is 1150° C. At this temperature, the thermal decomposition of the chromium fluoride $CrF_3$ used is slow, progressive and constant. Depending on the respective volumes involved, the presence of $Al_2O_3$ can moderate the flow of fluorinated vapours obtained. Under the influence of the argon flow into the box 1, there then occurs a continuous scavenging of the donor 9 by the fluorinated vapours to provide very volatile aluminium fluoride for contacting the parts 10 to be coated, circulation of the gases taking place, particularly inside the said parts 10, in a regular and continuous manner throughout the period of treatment. For a temperature of 1150° C. a treatment time of two hours is generally adequate. Different treatment temperatures and times may be used, which parameters are easily arrived at from satisfactory results obtained in a preliminary test, depending on the known treatment parameters for the alloy from which the parts to be treated are made. The superalloys, particularly Ni, Co or Fe based alloys, currently used for certain aircraft engine parts generally lead to the adoption of temperatures between 1050° C. and 1150° C. and treatment times of two to five hours. In the example of blades 10 shown in FIG. 1, the gas flow symbolized by the arrows 13 contacts the outer wall of each blade and passes through the internal cooling passages of the blade, entering through the vents and the openings provided on the edges and the walls of the blade, and leaving through the opening provided in the root of the blade. The desired protective coating is thus produced on the contacted external and internal surfaces of the blades as a result of aluminization by $AlF_3$, producing deposition and diffusion of aluminium on the surfaces: This reaction is well known, such as from French Patent No. 1 433 497.

The coating process in accordance with the invention as just described has the further advantage of being able to be associated, without modification of its operating conditions, with a more complex overall process of protecting the parts. Thus, a preliminary coating step may be carried out in which Cr, Pt or an alloy of M Cr Al Y type may be deposited, particularly on the outer surfaces of the parts, by any known process, followed by a protective coating process, particularly aluminization, carried out in accordance with the invention.

We claim:

1. A process for the simultaneous deposition of a protective coating on both external and internal surfaces of at least one heat-resistance object comprising the steps of:

providing a box comprising a donor of a metal to be deposited on said at least one object to be coated and, separately from said donor, an activator constituting a source of fluorine, said activator comprising a source of fluorine exhibiting a slow kinetic decomposition process in a range of temperatures of the deposition process;

locating said at least one object to be coated in said box, wherein a portion of said object not to be coated is placed outside of said box, wherein said internal surfaces of said at least one object to be coated define at least one passage through said object to be coated, wherein said at least one object to be coated is located in said box so that gases can escape from said box through said at least one passage through said at least one object to be coated, and wherein said at least one passage has an intake turned toward a direction of circulation of said fluorinated vapors;

heating said box to a temperature above 1000° C. to generate fluorinated vapours by thermal decomposition of said fluorine source from said activator; and introducing a controlled flow of a carrier gas into said box so as to cause circulation of gases within said box whereby said fluorinated vapours contact said donor to form a volatile fluoride vapour of said metal to be deposited and said volatile metal fluoride vapour is carried into contact with said external and internal surfaces of said at least one object to be coated to deposit said metal on said object to be coated and thereby form said protective coating thereon.

2. A process according to claim 1, wherein said protective coating deposited on said at least one part object to be coated is an aluminium-based coating.

3. A process according to claim 1, wherein said at least one object to be coated is made of an alloy selected from the group consisting of nickel-based, cobalt-based, and iron-based alloys.

4. A process according to claim 1, wherein said donor is in a granular form.

5. A process according to claim 1, wherein said carrier gas is a reducer gas.

6. A process according to claim 1, wherein said carrier gas is a neutral gas.

7. A process according to claim 6, wherein said carrier gas is argon.

8. A process according to claim 1, wherein said box is heated to a temperature between 1050° C. and 1150° C. and the duration of said process is between 2 and 5 hours.

9. A process according to claim 1, wherein at least the external surfaces of said at least one object to be coated are provided in a known manner with a prior coating based on Cr, Pt or a complex alloy of M Cr Al Y type.

* * * * *

UNITED STATES PATENT AND TRADEMARK OFFICE
CERTIFICATE OF CORRECTION

PATENT NO. : 5,068,127
DATED : 11/26/91
INVENTOR(S) : JEAN-PAUL FOURNES ET AL

It is certified that error appears in the above-identified patent and that said Letters Patent is hereby corrected as shown below:

Col. 1, line 16, delete "of".

Col. 2, line 54, delete "an";

Col. 2, line 54, insert --an-- before "apparatus;

Col. 2, line 62, insert --a-- before "container".

Col. 3, line 55, delete "said".

Col. 4, line 9, delete ":" and insert --.--.

Signed and Sealed this

Fifteenth Day of June, 1993

Attest:

MICHAEL K. KIRK

*Attesting Officer*     *Acting Commissioner of Patents and Trademarks*